United States Patent [19]

Daebler

[11] 4,072,177
[45] Feb. 7, 1978

[54] DIE SET FOR FORMING AXIAL LEADS OF ELECTRICAL COMPONENT INTO HAIRPIN LEAD PATTERN

[75] Inventor: Donald H. Daebler, Huntsville, Ala.

[73] Assignee: GTE Automatic Electric Laboratories Incorporated, Northlake, Ill.

[21] Appl. No.: 752,507

[22] Filed: Dec. 20, 1976

[51] Int. Cl.² .............................................. B21F 1/00
[52] U.S. Cl. .............................. 140/105; 72/DIG. 10
[58] Field of Search ................. 140/105; 72/DIG. 10; 227/86, 87, 88, 89

[56] References Cited

U.S. PATENT DOCUMENTS

| | | | |
|---|---|---|---|
| 3,149,340 | 9/1964 | Gagnon | 227/90 |
| 3,907,008 | 9/1975 | Bates et al. | 140/105 |

*Primary Examiner*—Lowell A. Larson
*Attorney, Agent, or Firm*—Russell A. Cannon; Leonard R. Cool

[57] ABSTRACT

The dies here comprise opposed sets of parallel-elongated members which are arranged for engagement to form component leads. Members at opposite ends of the dies cooperate in pairs to cut axial leads of a component positioned between the dies to prescribed lengths when the dies are engaged. A third member of one die has a slot through one of a pair of opposite sides thereof that are adjacent one end thereof and the component. A second pair of elongated members of the other die are positioned to move adjacent the opposite sides of the third member. When one lead of a component is held against the one end of the third member, with one ends of the second pair of members being proximate the component body and the free end of the one lead, engagement of the dies causes the second pair of members to force a portion of the component body into the slot and the one lead adjacent to the other opposite side of the third member to form the component leads into a hairpin pattern.

3 Claims, 5 Drawing Figures

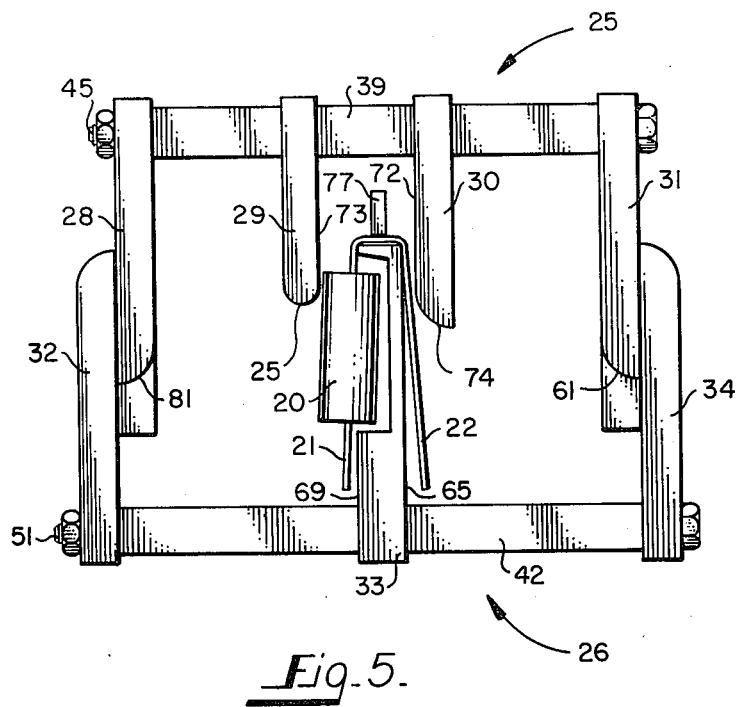
Fig. 5.
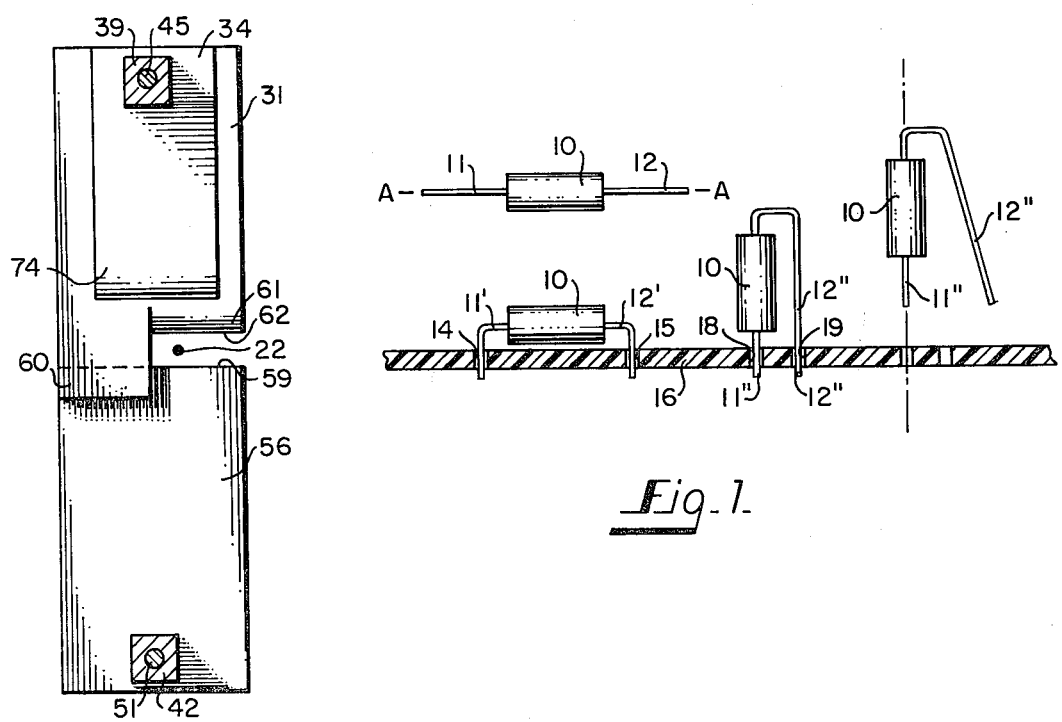
Fig. 3.
Fig. 1.

DIE SET FOR FORMING AXIAL LEADS OF ELECTRICAL COMPONENT INTO HAIRPIN LEAD PATTERN

BACKGROUND OF INVENTION

This invention relates to lead forming machines and more particularly to an improved die set for such machines for forming axial leads of an electrical component into a hairpin lead pattern.

In the manufacture of electrical equipment, leads of electrical components are inserted into plated-through-holes in a printed circuit board and then soldered to circuit patterns extending through these holes. In order to reduce the time required for the insertion operation, component leads are formed into a desired lead pattern prior to an operator or a machine inserting them into associated holes in a circuit board. This forming operation may be accomplished by hand or machine. It is a common practice on electrical components with axial leads to bend each lead at right angles to the component axis to form a horseshoe lead pattern. The bent leads are then inserted into the plated-through-holes of a circuit board. An alternate technique which conserves board space is to make two each 90° bends in the same one of the two axial leads of a component to form them into a hairpin lead pattern in which the leads are substantially parallel to each other at one end of the component. A machine for accomplishing this function employs a pair of axial disks which are spaced apart and rotate in parallel planes. The minimum spacing obtainable between the end of a component and the first 90° bend in a lead thereof is relatively long using this prior art technique.

An object of this invention is the provision of an improved die set which forms axial leads of an electrical component into a hairpin lead pattern.

SUMMARY OF INVENTION

In accordance with this invention, a first member of one die has an opening formed in one of a pair of opposing sides thereof, the opening being adjacent to one surface thereof against which one lead of an axial lead component is held. A pair of members of the other die are located for movement on opposite sides of the first member with associated one surfaces thereof proximate the component body and the free end of the one lead. When the dies are engaged, the one surfaces of the pair of members contact the component body and one lead to press the body into the opening and the free end of the one lead adjacent to the other opposing side of the first member to form the component leads into a hairpin lead pattern.

BRIEF DESCRIPTION OF DRAWINGS

This invention will be more fully understood from the following detailed description of preferred embodiments thereof, together with the attached drawings in which:

FIG. 1 is a section view of a printed circuit board 16 and electrical components which initially have a pair of axially aligned leads;

FIG. 3 is a section view of the die set in FIG. 2 looking in the direction of the arrows 3—3;

FIG. 5 is a top view similar to FIGS. 2 and 4 with the movable die 25 fully extended in forming the leads 21 and 22 of component 20 into a hairpin lead pattern, and a substantially parallel relationship.

DESCRIPTION OR PREFERRED EMBODYMENTS

Figure 2:
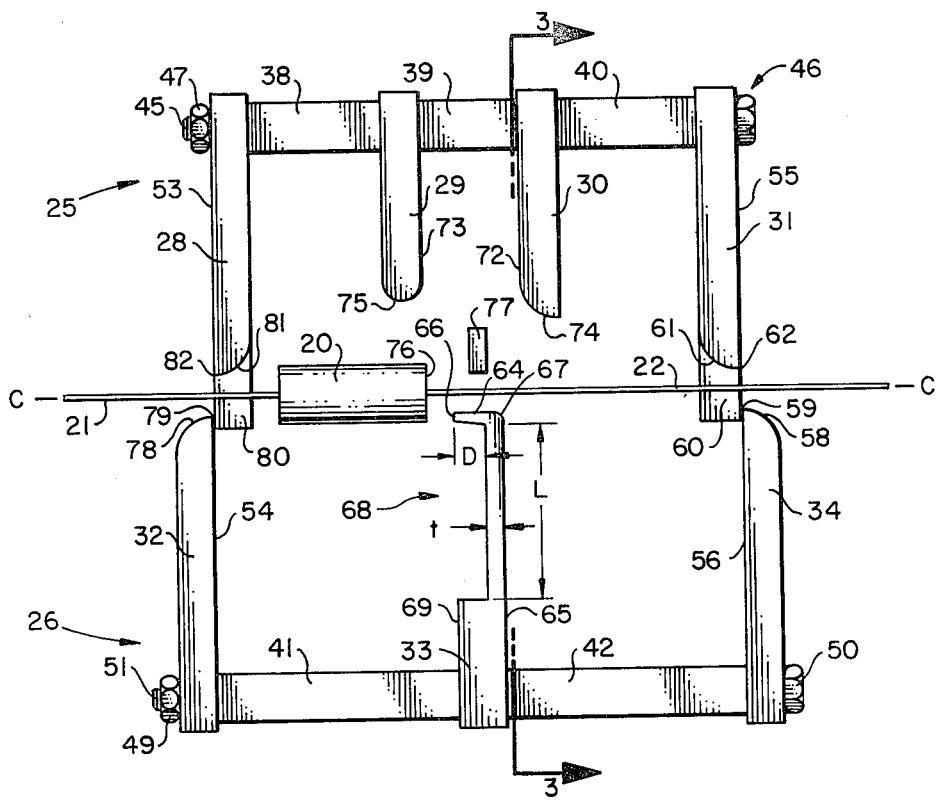
FIG. 2 is a top view of a die set embodying this invention for cutting and forming axial leads 21 and 22 of an electrical component 20 into a hairpin lead pattern, and showing the relationship of various parts of the dies 25 and 26 in a non-extended position.

The component 10 having axial leads 11 and 12 in FIG. 1 is representative of electrical components such as capacitors and resistors which have cylindrical bodies and axial leads. A conventional method of mounting such components in electrical circuits is to bend each of the leads 11 and 12 at right angles to the component axis A—A to form them into a horseshoe lead pattern. The bent leads 11' and 12' of the component are them inserted into associated plated through holes 14 and 15 in a printed circuit board 16. Board space is conserved if only one lead 12, for example, is bent to form axial leads 11 and 12 into a hairpin pattern in which the bent leads 11" and 12" are at least approximately parallel to each other. These bent leads 11" and 12" are squeezed together as they are inserted into associated plated-through-holes 18 and 19 that are closer together on the circuit board 16 than are the other holes 14 and 15 for a component having a horseshoe lead pattern.

Figure 4:
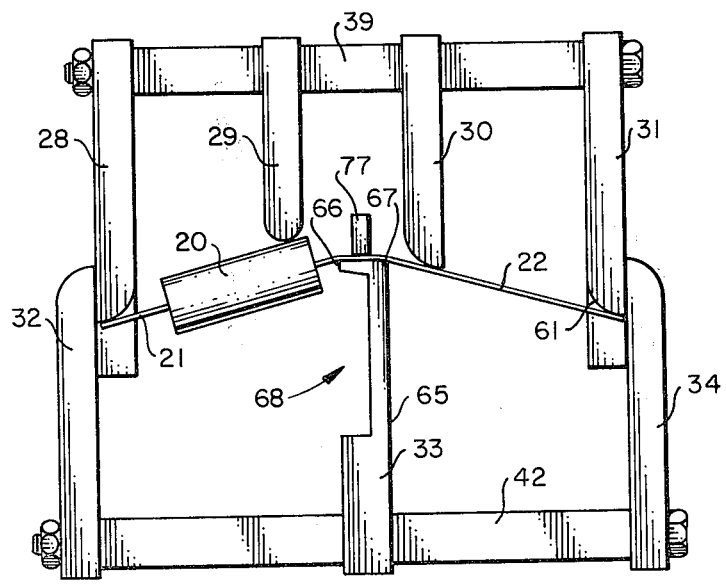
FIG. 4 is a top view similar to FIG. 2 and showing an intermediate position of the movable die 25 in forming the leads 21 and 22 of the component 20 into a hairpin lead pattern.

Top views of a die set embodying this invention for operating in a conventional lead forming machine (not shown) for forming the axial leads 21 and 22 of an axial lead component 20 into a hairpin lead pattern is illustrated in FIGS. 2, 4 and 5. The die set is shown in its non-extended position in FIG. 2; in an intermediate position in FIG. 4; and in its extended position in FIG. 5. The die set comprises a movable die 25 and a stationary die 26 which are located on opposite sides of a center line C—C. The axis of component 20 and leads 21 and 22 are coincident with this center line C—C.

The movable die 25 comprises four elongated members 28, 29, 30 and 31 which have generally rectangular cross sections and are spaced prescribed distances apart by spacers 38, 39 and 40. The stationary die 26 comprises three elongated members 32, 33 and 34 which also have generally rectangularly shaped cross sections and are spaced prescribed distances apart by spacers 41 and 42. The sides of all of the members 28–34, inclusive, are orthogonal to the plane of the paper in FIG. 2 and are parallel to each other. The relative positions of members 28–31 of die 25 are fixed by the shaft 45 of a bolt 46 which extends through the spacers 38–40, one ends of the members 28–31, and a nut 47. The relative positions of the members 32–34 of the other die 26 are fixed in a similar manner by a nut 49 and bolt 50. The spacing between different ones of the members of the dies may be adjusted by changing the lengths of spacers located between them.

The outside members of the two dies cooperate in pairs to cut the leads 21 and 22 to desired lengths. Since the pairs of members 28, 32 and 31, 34 are similar, only the latter pair 31, 34 will be described in detail in relation to FIG. 2 and the section view in FIG. 3. The other end of member 34 has a curved outside edge 58 which joins with the flat side 56 thereof to form a cutting edge 59 that is spaced away from the center line C—C on one side thereof. The other end of the other member 31 of this pair of cutting members has a projection 60 which extends across the center line C—C and beyond the cutting edge 59 of member 34 when the dies are in their non-extended position. This member 31 also has a curved inside edge 61 which joins the flat edge 55 thereof to form a second cutting edge 62 that is spaced away from the center line C—C on the other side thereof. The lead 22 is located between the cutting edges 59 and 62 when the dies are in the non-extended position (see FIG. 3).

The member 33 is located approximately half-way between the cutting members 32 and 34 of the stationary die 26. The end 64 of this intermediate member 33 is flat and orthogonal to the side 65 thereof. Both of the edges 66 and 67 on the end 64 are rounded to remove any sharp angles from a corner which may contact a component lead. A slot 68 is formed in one side 69 of the member 33 proximate the end 64 thereof. The thickness of the member 33 between the end 64 and the slot is preferably made as small as practicable. The length L of the slot 68 is greater than the length of the longest body of a component 20 that is to be accommodated by this die set. The depth D of this slot 68 is slightly greater than one half the diameter of the largest body of a component 20 that is to be operated on by the dies. Also, the thickness $t$ of the member 33 at the back of the slot 68 is as small as practicable.

The member 30 is located in the die 25 so that the parallel planes containing the edges 65 and 72 of associated members 33 and 30 are spaced apart a distance which is only slightly greater than the diameter of the lead 22. The member 29 is positioned in the die 25 to be in line with the component body and to have parallel planes containing the sides 69 and 73 of associated members 33 and 29 spaced apart by a distance that is only slightly greater than one half the diameter of the component body. The other end of member 30 adjacent line C—C has a curved inside edge 74 which provides a smooth surface for contacting and sliding on the lead 22. Both edges of the end 75 of member 29 are curved to provide smooth surfaces for contacting and sliding on the circumference of the body of component 20.

Although the dies 25 and 26 are specifically designed for use in a MARK V component lead forming machine manufactured by Technical Devices Company of Culver City, California, they may be adapted for operating in other lead forming machines without departing from the spirit of this invention. The dies 25 and 26 are mounted in a horizontal position as is shown in FIG. 2 in the MARK V machine. This machine has a pair of elongated clamps (not shown) for contacting the one ends of the members 28–34 adjacent the spacers of associated dies 25 and 26. The clamps hold the dies in the fixed relationships shown in FIG. 2 while at the same time allowing the die 25 to move across the center line C—C in the plane of the paper and into engagment with the other die 26. The machine also includes means (not shown) for vertically feeding components 20 between the dies 25 and 26 at a prescribed rate with the end 76 of a component 20 spaced at least a minimum prescribed distance from the edge 66 of member 33. This minimum distance is slightly greater than the thickness of the portion of member 33 between the end 64 thereof and slot 68. This feeding of components into the die set may be done by hand or done mechanically by manually or automatically fed chutes, a zig-zag fed chute, or a de-reeler feed mechanism for operating with taped components. The machine also has a clamping finger 77 which aids in temporarily fixedly securing the component 20 in place in a die set.

In operation, when a component 20 is located between dies 25 and 26, the clamping finger 77 moves forward to force lead 22 against the end 66 of member 33 in order to temporarily fixedly secure the lead 22 and component 20 in the position shown in FIG. 2. As the die 25 moves forward in the horizontal direction into engagement with the stationary die 26, the pairs of cutting edges 59, 62 and 79, 82 of the end pairs of members pass each other to cut leads 21 and 22, respectively, to desired lengths. The curved edges 61 and 81 of associated moving cutting members 31 and 28, respectively, then contact associated leads 22 and 21 to push them toward the spacers 41 and 42 in the stationary die set 26. As the die 25 continues to move forward, the curved edges of forming members 29 and 30 contact the body of component 20 and lead 22, respectively, as is shown in FIG. 4 to bend lead 22 around the opposite edges 66 and 67 (see FIG. 2) of member 33. Further movement of the die 25 forces the component body into slot 68 and the free end of lead 22 adjacent to the side 65 of member 33 so that leads 21 and 22 are approximately parallel to each other when the dies are fully engaged as is shown in FIG. 5. The die 25 then returns to its initial position which is shown in FIG. 2 and the clamping finger 77 moves away from lead 22 to allow the formed component 20 to fall through the slot 68 and into a hopper (not shown) under the slot.

Although this invention is described in relation to a preferred embodiment thereof, variations and modifications will be apparent to those skilled in the art without departing from the spirit of this invention. By way of example, the die 25 may be stationary and the die 26 movable. Alternatively, both of the dies 25 and 26 may be movable. Also, it is not essential that the dies 25 and 26 move in directions that are parallel to the plane of the paper in FIG. 2 or that all of the edges of the various members be parallel. The objects of this invention will still be accomplished if the forming members 29 and 30 are located at angles with respect to the anvil member 33 such that only curved edges 75 and 74 of the forming members contact the component body and lead 22, respectively. In order to form the leads of several components simultaneously, the dimension of members in the horizontal direction in FIG. 3 may be increased. The dies 25 and 26 may also be operated in a vertical plane and other means such as air pressure, rather than gravity, used to eject formed components from the die set. This die set also operates on components which are other than cylindrical and which have more than one component lead extending from each end of a component. The scope of this invention is therefore defined from the attached claims rather than from the above detailed descriptions of preferred embodiments thereof.

I claim:

1. An improved die set for a machine for forming component leads which extend in substantially opposite directions from the body of a component into a pattern; the machine including structure for holding the dies spaced apart in a first plane on opposite sides of the component axis through component leads in the first plane and facing each other for subsequent movement and engagement in the first plane to form the component leads, structure for contacting one lead of a component located between the dies for aiding in temporarily fixedly securing the position of the one lead and the component body, and means for providing relative movement of the dies in the first plane such that they engage each other in an extended position to form the component leads; the improved die set being adapted for forming the component leads into a hairpin lead pattern, and comprising:

a first die comprising first and second elongated finger members having one end held by the holding structure so as to be in a substantially parallel spaced apart relationship in the first plane, the other ends thereof for contacting a component body and the one lead thereof, respectively, being curved convexly toward the component axis in the first plane; and a second die comprising a third elongated finger member which is a forming anvil that is held on one end by the holding structure so as to be substantially parallel to said first and second members, the other end thereof being adjacent the component axis, said anvil having in the first plane portions of first and second opposite surfaces that are adjacent the other end thereof, said first opposite surface having an opening formed in said anvil that is spaced a prescribed distance from said other end thereof and being dimensioned for receiving therein a portion of the component body spaced toward the other end of said anvil from a second plane that is orthogonal to the first plane through the component axis;

the contacting structure of the machine pressing the one lead against the other end of said anvil with one point on the perimeter of the component body being in the first plane and being spaced away from said first and second members with one end of the component body being adjacent said first opposite surface of said anvil and being spaced in the first plane from said first opposite surface a distance which is greater than the prescribed distance; the component body being aligned with the other end of said first member in the first plane and at least a portion of the one lead extending past said second opposite surface of said anvil being aligned with the other end of said second member in the first plane;

relative movement of the dies in the first plane causing the other ends of said first and second members to contact the component body and the one lead, respectively, and to move beyond the other end of said anvil on opposite sides of the latter such that said first and second members press a portion of the component body into said opening in said anvil and the one lead adjacent to said second opposite surface of said anvil, respectively, to form the component leads into a hairpin lead pattern in which the leads are substantially parallel to each other adjacent to the other end of the component.

2. The improved die set according to claim 1 wherein the opening in said anvil is an elongated slot which extends in directions orthogonal to said first plane and through sides of said anvil.

3. The improved die set according to claim 1 wherein said first, second and third members are elongated in directions orthogonal to the first plane for forming the leads of a plurality of components simultaneously.

* * * * *